United States Patent [19]

Gelpey et al.

[11] 4,354,109

[45] Oct. 12, 1982

[54] MOUNTING FOR PYROELECTRIC DETECTOR ARRAYS

[75] Inventors: William J. White, Chelmsford; Jeffrey C. Gelpey, Peabody; Donald E. Marshall, Jr., Harvard, all of Mass.

[73] Assignee: Honeywell Inc., Minneapolis, Minn.

[21] Appl. No.: 254,845

[22] Filed: Apr. 17, 1981

Related U.S. Application Data

[63] Continuation of Ser. No. 108,759, Dec. 31, 1979, abandoned.

[51] Int. Cl.³ .............................................. G01J 1/00
[52] U.S. Cl. .................................... 250/349; 250/332
[58] Field of Search .................... 250/332, 338, 349; 29/832, 840, 854

[56] References Cited

U.S. PATENT DOCUMENTS 3,581,092  5/1971  Pearsall ............................. 250/349
3,676,252  7/1972  Allington ............................. 29/832
3,932,756  1/1976  Cowell et al. .................. 250/361 R
4,039,833  8/1977  Thom ................................. 250/332
4,062,107  12/1977  Blackman et al. ................. 250/332
4,072,863  2/1978  Roundy ............................. 250/332
4,110,616  8/1978  Porter et al. ........................ 250/332

Primary Examiner—Davis L. Willis
Attorney, Agent, or Firm—John S. Solakian; Laurence J. Marhoefer

[57] ABSTRACT

A mounting means for apparatus useful for processing infrared signals including a pyroelectric detector array with a plurality of detector elements, a plurality of electrically conductive epoxy polymer mounting means having two ends and attached at one end to the detector array to provide individual electrical contact for each of the detector elements. The apparatus further includes circuit means attached to the other end of the mounting means for processing electrical signals from the array.

9 Claims, 1 Drawing Figure

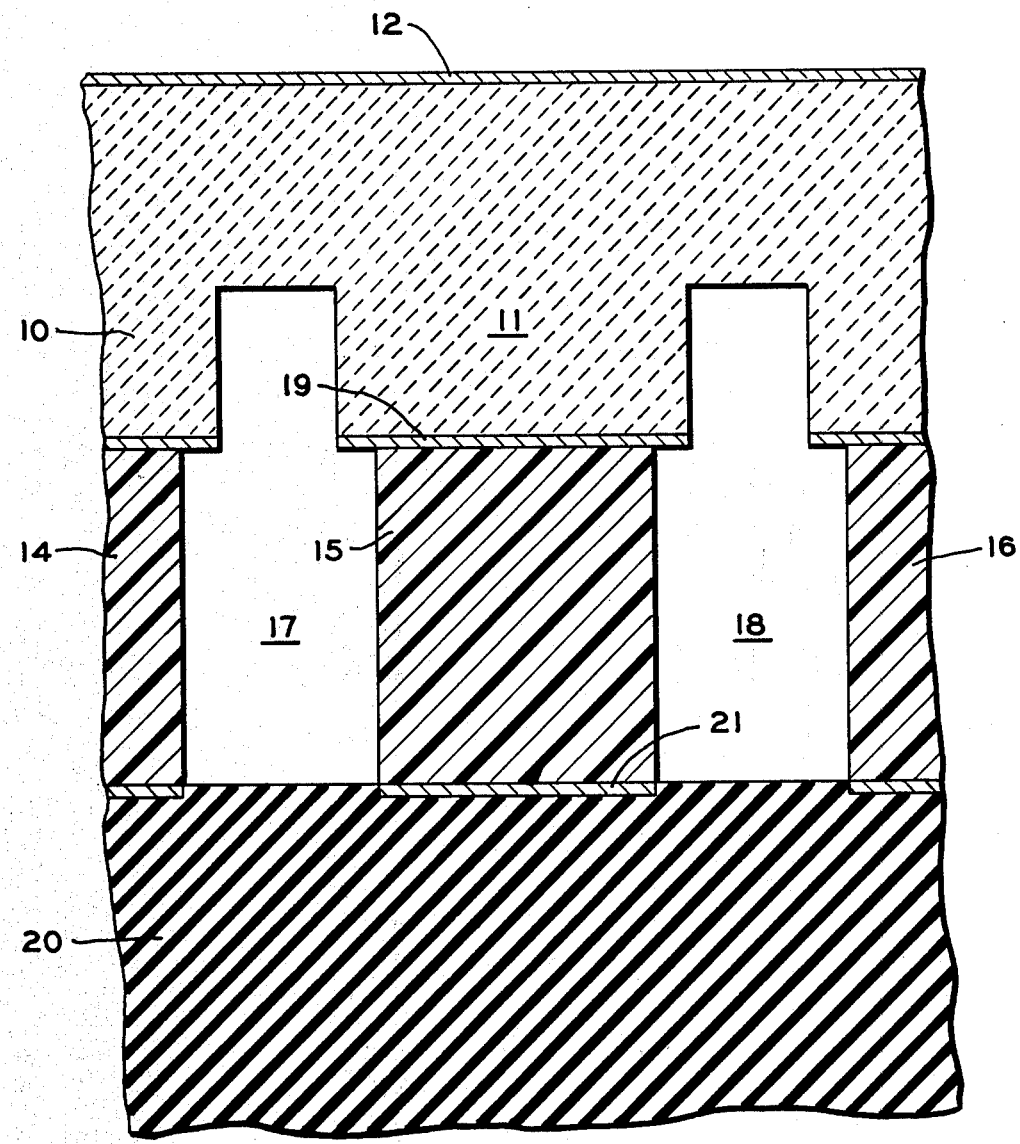

MOUNTING FOR PYROELECTRIC DETECCTOR ARRAYS

This application is a continuation of application Ser. No. 108,759, filed Dec. 31, 1979 and now abandoned.

BACKGROUND OF THE INVENTION

Pyroelectric detector performance is dependent upon its thermal response to an infrared source. Pyroelectric materials generate signals in response to such radiation which can be processed to obtain useful information for a wide variety of applications. Transfer of the information from the pyroelectric array to the circuitry which converts the information into meaningful data, however, is a major concern due to the nature of the pyroelectric materials. Signals generated in the pyroelectric material are transmitted through an electrically conductive mounting means. Performance of the array is substantially enhanced, however, by improved thermal insulation. Ideally, the mounting means should be electrical conductors and thermal insulators, two characteristics which are inherently incompatible.

Various prior art methods of bonding the pyroelectric array to the circuitry have been unable to solve the problem of unwanted thermal conductivity. U.S. Pat. No. 4,039,833 teaches the use of solder terminals, preferably indium, which are in a bump form, for the purpose of obtaining information from the detector array. Similarly, U.S. Pat. No. 4,072,863 teaches the use of metalization electrodes which apparently are designed to conduct electric signals from the array. Other prior art patents, such as U.S. Pat. No. 4,062,107, disclose the concept of employing epoxy resins as bonding agents in their conventional manner, wherein the epoxy acts as a bond forming material to physically mount one device upon another.

Accordingly, it is an object of this invention to provide an improved mounting system for pyroelectric array devices to permit efficient electrical contact between the array and the processing circuitry while providing simultaneously maximum degree of thermal insulation. Other objects will appear hereinafter.

DESCRIPTION OF THE INVENTION

It has now been discovered that a suitable mounting device for a pyroelectric detector array can be provided in the following manner. Specifically, it has been discovered that a useful apparatus for processing infrared signals employing a pyroelectric detector array which has a plurality of detector elements can be mounted to a circuit means for processing electrical signals from the array in the following manner. A plurality of electrically conductive epoxy polymer mounting means are attached at one end to the array to provide individual electrical contact and attached at the other end to the circuit means to permit processing of the electrical signals generated by each of the detector elements.

A wide variety of pyroelectric materials may be employed in the manufacture of arrays. Among these are lithium tantalate, strontium barium niobate, and triglycene sulfate. Conventional circuit means can be employed for processing the signal derived from the pyroelectric detector array.

One of the primary characteristics of a pyroelectric detector array, and the attendant electronics, is the thermal responsivity measured in degrees K per watt. This factor of thermal responsivity, $R_T$, is defined as the spatial average temperature change for the excited detector divided by the incident detector heat in watts. This thermal responsivity is a factor in measuring the "G" factor which is defined as the thermal conductance per unit area. This controls the heat loss due to the environment. The "G" factor is calculated by dividing 1 by the product of the thermal responsivity and the detector area in square centimeters. Thus, a high value for thermal responsivity indicates a high change in temperature per amount of incident heat, while a low "G" factor indicates that loss to the environment is relatively low.

As stated above, the mounting means employed in the present invention consists of a plurality of electrically conductive epoxy polymer mounting means having two ends, one of which is attached to the array to provide individual electrical contact for each of the detector elements and the other which is attached to the circuit means for processing electrical signals from the array. The plurality of electrically conductive epoxy polymer mounting means may be placed upon either the circuit or the array, or both, by depositing a layer of epoxy material containing a conductive agent followed by ion beam milling, machining, using optical cutting equipment and the like or other means for creating islands of conductive epoxy which can be bonded to both the detector elements and the circuitry.

Any of the conventional commercially available epoxy resins which have been filled with conductive materials may be employed in the present invention. Particularly preferred is Stycast 1970, a castable electrically conductive epoxy resin manufactured by Emerson and Cuming, Inc. It is preferred that the electrically conductive epoxy resin have a conductivity of at least $5 \times 10^{-7}$ mho/cm. It is also preferred that the thermal conductivity of the epoxy resin be less than $10^{-2}$ watt/cm$^2$ °C.

For a more complete understanding of the invention, reference is hereby made to the drawing, in which the figure represents a section view of one embodiment of the present invention. A pyroelectric detector array having individual elements 10 and 11 is fitted with an outer surface layer 12, usually manufactured of platinum or other highly conductive materials, to permit incident infrared radiation to impinge upon the individual detector elements 10 and 11. A plurality of electrically conductive apoxy polymer mounting means 14, 15 and 16 are provided such that one end of the elements 14, 15, 16 and the like are attached to the individual detector array elements 10 and 11 through conductive mounting means 19, which is a conductive material such as platinum. The other end of the conductive epoxy polymer mounting means 15 is attached to an electronic circuit means 20 through conductive bonding agents 21 which may be materials such as aluminum and other conductive materials. Thus, incident radiation strikes outer surface 12 and excites one or more of the individual elements 10, 11 and the like to create a pyroelectric generated signal. This signal is electrically conducted to the circuit means 20 through electrically conductive epoxy polymer mounting means 15 for further processing.

To demonstrate the efficiencies of the present invention, several detectors were evaluated under identical circumstances of incident radiation. The only difference between the two arrays was the mounting means for mounting the individual detector elements to the electronic circuitry. In one instance, metallic indium was employed as a mounting means while in the other experiment an epoxy mounting means was used, using the previously described Stycast 1970. At an incident frequency of 10 hertz, the detector having the indium mounting means had a thermal responsivity $R_T$ of 1628° K. per watt while identical radiation produced a thermal responsivity in the detector array employing the conductive epoxy mounting means of 6,341° K. per watt. This was an improvement of approximately 3.9 times.

In similar experiments, the "G" value was calculated for both the indium mounted array and the epoxy mounted array. The "G" value for the indium design was 23.8 watts per centimeter squared degrees C. while the epoxy design according to the present invention had a "G" value of 6.0 watts per centimeter squared degrees C. Again, almost a factor of 4 improvement was noted using the present invention.

We claim:

1. Apparatus for processing infrared signals, comprising:
    a pyroelectric detector array including a plurality of detector elements;
    a plurality of electrically conductive epoxy polymer mounting means having two ends and attached at one end to said array to provide individual electrical contact for each of said detector elements;
    circuit means attached to the other end of said mounting means for processing electrical signals from said array; and
    means included in said mounting means for providing electrical conductivity between said array and said circuit means sufficient to enable the interoperation thereof while in addition providing thermal isolation so that said array has an improved thermal responsivity.

2. The apparatus of claim 1 wherein said pyroelectric material is selected from the group consisting of lithium tantalate, strontium barium niobate and triglycene sulfate.

3. The device of claim 1 wherein said epoxy polymer has an electrical conductivity of at least $5\times10^{-7}$ mho/cm and a thermal conductivity of less than $10^{-2}$ watt/cm$^2$ °C.

4. The device of claim 1 wherein said improved thermal responsivity is at least twice that provided by an indium mounting means.

5. The device of claim 1 wherein said infrared thermal responsivity is at least a factor of three times greater than that provided by an indium mounting means.

6. In a device for processing infrared signals having a pyroelectric detector array including individual detector elements and a circuit means for processing electrical signals from each of said elements, the improvement comprising:
    a plurality of electrically conductive epoxy polymer mounting means having two ends and attached at one end to said array to provide individual electrical contact for each of said elements and attached at the other end of said mounting means to provide contact with said circuit means,
    wherein the material utilized in said mounting means has sufficient electrical properties to enable the proper operation between each of said elements and said circuit means and also has a thermal isolation property so that said array provides an improved thermal responsivity thereby enhancing the operation of said device.

7. The device of claim 6 wherein said epoxy polymer has an electrical conductivity of at least $5\times10^{-7}$ mho/cm and a thermal conductivity of less than $10^{-2}$ watt/cm$^2$ °C.

8. The device of claim 6 wherein said improved thermal responsivity is at least twice that provided by an indium mounting means.

9. The device of claim 6 wherein said infrared thermal responsivity is at least a factor of three times greater than that provided by an indium mounting means.

* * * * *